(12) United States Patent (10) Patent No.: US 8,034,252 B2
Yamashita (45) Date of Patent: Oct. 11, 2011

(54) METAL-POLISHING LIQUID AND CHEMICAL-MECHANICAL POLISHING METHOD USING THE SAME

(75) Inventor: Katsuhiro Yamashita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 1068 days.

(21) Appl. No.: 11/701,403

(22) Filed: Feb. 2, 2007

(65) Prior Publication Data

US 2007/0167016 A1 Jul. 19, 2007

(30) Foreign Application Priority Data

Feb. 13, 2006 (JP) .................................. 2006-035853

(51) Int. Cl.
*H01L 21/461* (2006.01)
(52) U.S. Cl. ............ 252/79.1; 51/308; 451/36; 438/693
(58) Field of Classification Search ........................ None
See application file for complete search history.

(56) References Cited

U.S. PATENT DOCUMENTS

| | | | | |
|---|---|---|---|---|
| 3,922,393 | A | 11/1975 | Sears, Jr. | |
| 4,673,524 | A * | 6/1987 | Dean .............. | 510/413 |
| 4,944,836 | A | 7/1990 | Beyer et al. | |
| 5,545,429 | A * | 8/1996 | Booth et al. ............. | 205/125 |
| 5,795,695 | A * | 8/1998 | Malhotra et al. ........ | 430/124.52 |
| 6,301,770 | B1 * | 10/2001 | McIlwraith ................ | 29/527.2 |
| 6,485,812 | B1 * | 11/2002 | Sekiguchi ................ | 428/32.29 |
| 6,527,818 | B2 | 3/2003 | Hattori et al. | |
| 6,565,619 | B1 | 5/2003 | Asano et al. | |
| 6,893,476 | B2 * | 5/2005 | Siddiqui et al. .............. | 51/307 |
| 7,118,685 | B1 * | 10/2006 | Yoneda et al. ............... | 252/79.1 |
| 7,153,335 | B2 * | 12/2006 | Siddiqui et al. .............. | 51/307 |
| 7,300,480 | B2 | 11/2007 | Bian et al. | |
| 7,309,684 | B2 * | 12/2007 | Filippini et al. ............. | 510/201 |
| 7,514,363 | B2 | 4/2009 | Banerjee et al. | |
| 7,527,861 | B2 * | 5/2009 | Li et al. ..................... | 428/411.1 |
| 7,547,670 | B2 * | 6/2009 | Gross et al. .................. | 510/197 |
| 7,604,751 | B2 * | 10/2009 | Yoneda et al. ............... | 216/88 |
| 7,625,967 | B2 * | 12/2009 | St. Clair ....................... | 524/315 |
| 7,691,287 | B2 * | 4/2010 | Siddiqui et al. ............. | 252/79.1 |
| 2002/0055562 | A1 * | 5/2002 | Butuc ............................ | 524/80 |
| 2003/0061766 | A1 | 4/2003 | Vogt et al. | |
| 2003/0157804 | A1 * | 8/2003 | Puppe et al. ............... | 438/692 |
| 2004/0040217 | A1 * | 3/2004 | Takashina et al. ............ | 51/307 |
| 2004/0044116 | A1 * | 3/2004 | Olson et al. ................. | 524/502 |
| 2004/0109853 | A1 * | 6/2004 | McDaniel .................. | 424/94.6 |
| 2004/0175407 | A1 * | 9/2004 | McDaniel ................... | 424/423 |
| 2004/0186206 | A1 * | 9/2004 | Yoneda et al. ............... | 524/95 |
| 2004/0244300 | A1 | 12/2004 | Ichiki et al. | |
| 2005/0076578 | A1 * | 4/2005 | Siddiqui et al. .............. | 51/307 |
| 2005/0090109 | A1 | 4/2005 | Carter | |
| 2005/0112892 | A1 | 5/2005 | Chen et al. | |
| 2005/0118821 | A1 | 6/2005 | Minamihaba et al. | |
| 2005/0142084 | A1 * | 6/2005 | Ganguly et al. ............. | 424/63 |
| 2005/0208883 | A1 | 9/2005 | Yoshida et al. | |
| 2006/0117667 | A1 * | 6/2006 | Siddiqui et al. .............. | 51/309 |
| 2006/0182788 | A1 * | 8/2006 | Singh et al. ................. | 424/448 |
| 2006/0240672 | A1 * | 10/2006 | Yoneda et al. ............... | 438/692 |
| 2007/0036738 | A1 * | 2/2007 | Fletcher et al. .................. | 424/65 |
| 2007/0045233 | A1 * | 3/2007 | Yoneda et al. ................... | 216/88 |
| 2007/0093187 | A1 | 4/2007 | Takenouchi | |
| 2007/0167016 | A1 * | 7/2007 | Yamashita ..................... | 438/692 |
| 2007/0176142 | A1 * | 8/2007 | Kikuchi ......................... | 252/79.1 |
| 2007/0181850 | A1 * | 8/2007 | Kamimura et al. ........... | 252/79.1 |
| 2007/0186484 | A1 | 8/2007 | Yamashita et al. | |
| 2007/0275021 | A1 * | 11/2007 | Lee et al. ........................ | 424/401 |
| 2008/0057336 | A1 * | 3/2008 | Kurokawa et al. ............. | 428/639 |
| 2008/0057716 | A1 * | 3/2008 | Yamashita ..................... | 438/693 |
| 2008/0182485 | A1 * | 7/2008 | Siddiqui et al. ................. | 451/36 |
| 2009/0258060 | A1 * | 10/2009 | Cleary et al. .................. | 424/448 |

FOREIGN PATENT DOCUMENTS

| | | |
|---|---|---|
| EP | 1813656 A2 | 8/2007 |
| JP | 49-122432 A | 11/1974 |
| JP | 63-123807 A | 5/1988 |
| JP | 2-278822 A | 11/1990 |
| JP | 6-199515 A | 7/1994 |
| JP | 11-186202 A | 7/1999 |
| JP | 2000084832 | 3/2000 |
| JP | 2001-127019 A | 5/2001 |
| JP | 2001-139935 A | 5/2001 |
| JP | 3192968 B2 | 7/2001 |
| JP | 2002 164307 A | 6/2002 |
| JP | 2003-017446 | 1/2003 |
| JP | 2003/151928 A | 5/2003 |
| JP | 2003142435 A | 5/2003 |
| JP | 2003-197573 A | 7/2003 |
| JP | 2004-123921 A | 4/2004 |
| JP | 2004-235317 A | 8/2004 |

(Continued)

OTHER PUBLICATIONS

European Search Report issued in European Application EP 07002005.2 dated Jul. 30, 2009.
Haba, S. et al. "Metal-film Abrasive Compound for Polishing," Derwent Information Lt.d, pp. 1-8, 2009.
Office Action dated Nov. 24, 2010 on Japanese Patent Application No. 2006-035853.

(Continued)

*Primary Examiner* — Allan Olsen
(74) *Attorney, Agent, or Firm* — Sughrue Mion, PLLC

(57) ABSTRACT

A metal-polishing liquid includes colloidal silica and a compound represented by Formula (I) or a compound represented by Formula (II). The colloidal silica is substituted by aluminum atoms at least one portion of the silicon atoms on the surfaces thereof. In Formula (I), $R^1$ represents an alkyl group, alkynyl group, alkenyl group, allyl group or aryl group; $R^2$ represents hydrogen atom, an alkyl group, alkynyl group, alkenyl group, allyl group or aryl group; m represents an integer from 0 to 6. In Formula (II), $R^3$ represents an alkyl group or aryl group; n represents an integer from 1 to 30.

$$R^1\text{—OOC—}(CH_2)_m\text{—COO—}R^2 \qquad \text{Formula (I)}$$

$$R^3\text{—O—}(CH_2CH_2O)_n\text{—SO}_3H \qquad \text{Formula (II)}$$

16 Claims, No Drawings

FOREIGN PATENT DOCUMENTS

| | | |
|---|---|---|
| JP | 2004 363574 A | 12/2004 |
| JP | 2005-045229 A | 2/2005 |
| JP | 2005 142542 A | 6/2005 |
| JP | 2005 167204 A | 6/2005 |
| JP | 2005-177970 A | 7/2005 |
| JP | 2005-183684 A | 7/2005 |
| JP | 2005-277248 A | 10/2005 |
| JP | 2008-512871 A | 4/2008 |
| WO | 0104231 A1 | 1/2001 |
| WO | WO 0104231 A1 * | 1/2001 |
| WO | 2002/067309 | 8/2002 |
| WO | 2004/101221 A | 11/2004 |

OTHER PUBLICATIONS

Office Action dated Nov. 24, 2010 on Japanese Patent Application No. 2006-023205.

Japanese Office Action mailed Mar. 8, 2011 on JP 2006-023203.

Japanese Office Action mailed Feb. 15, 2011 on JP 2006-023205.

* cited by examiner

METAL-POLISHING LIQUID AND CHEMICAL-MECHANICAL POLISHING METHOD USING THE SAME

CROSS REFERENCE TO RELATED APPLICATIONS

This application claims priority under 35USC 119 from Japanese patent Application No. 2006-035853, the disclosure of which is incorporated herein by reference.

FIELD OF THE INVENTION

The present invention relates to the manufacture of a semiconductor device, and specifically to a metal-polishing liquid in the wiring process and a chemical-mechanical polishing method using the same.

DESCRIPTION OF THE RELATED ART

In the development of semiconductor devices, as represented by a large-scale integrated circuit (hereinafter, referred to as LSI), densification and enhancement of integration by poly-lamination of and formation of finer wiring have recently been demanded for the purpose of miniaturization and higher speed. For these purposes, a variety of techniques such as Chemical Mechanical Polishing (hereinafter, referred to as CMP) have been used. This CMP is an essential technique when surface flattening of processed films such as an interlayer insulating film, plug formation, formation of embedded metal wiring, or the like is carried out, and removes an extra metal thin film during substrate smoothing and wire formation. A description of this technique can be found in, for example, U.S. Pat. No. 4,944,836.

A general CMP method involves sticking a polishing pad on a circular polishing platen, soaking the surface of the polishing pad with a polishing liquid, pushing the surface of a wafer on the pad, rotating both the polishing platen and the wafer under conditions of a specified pressure (polishing pressure) from the back surface side of the wafer, and flattening the wafer surface by means of generated mechanical friction.

Conventionally, tungsten and aluminum have been generally used as metals for wiring in interconnection structures. With the aim of higher performance, however, LSIs have been developed in which copper having a wiring resistance lower than those of these metals is used. The Damascene method is known as a method of forming wiring with this copper (see, for example, Japanese Patent Application Laid-Open (JP-A) No. 2-278822). Additionally, the dual Damascene method has bean widely used which involves simultaneously forming both a contact hole and a wiring groove in an interlayer insulating film, and embedding a metal in the both of these. A copper target having a high purity of five nine (99.999%) or more has been commercially available as a target material for the copper wiring. However, with recent formation of finer wiring aimed at further densification, improvements in the electrical conductivity, electronic properties and the like of copper wiring have become necessary. As such, the use of a copper alloy made by addition of a third component to highly pure copper has begun to be investigated. At the same time, high-speed metal-polishing methods capable of high productivity without contamination of these highly minute and highly purified materials are demanded. Polishing of a metal of copper readily generates the above-mentioned dishing, erosion or scratches due to its particular softness, and thus a polishing technique with higher precision is required.

Recently, for the purpose of increased productivity, the size of a wafer during LSI production has been increased more and more. Presently, a wafer having a diameter of 200 mm or more is widely used, and a wafer having a size of 300 mm or more has begun to be manufactured. With such an increase in the size of a wafer, a difference in polishing speed between the center portion and the peripheral portion of the wafer is easily generated, and demand with respect to uniformity in polishing within the wafer surface has become increasingly severe.

A chemical polishing method without mechanical polishing means for copper and copper alloys is known as disclosed in, for example, JP-A No. 49-122432. However, the chemical polishing method, which is carried out only by chemical dissolving action, poses a large problem with respect to flatness because of the generation of concave wearing, i.e., and thus dishing and the like, as compared with CMP in which a convex portions of a metal film selectively perform chemical mechanical polishing.

When using copper wiring, a dispersion preventing layer, called a barrier layer, is usually provided between the wiring portion and an insulating layer for the purpose of preventing dispersion of copper ions into an insulating material, and the barrier layer is made of one layer or two or more layers selected from TaN, TaSiN, Ta, TiN, Ti, Nb, W, WN, Co, Zr, ZrN, Ru and CuTa alloys. However, since these barrier materials themselves have electrical conductivity, the barrier material on the insulating layer must be completely removed for the sake of preventing error generation due to leaked current or the like. This removing processing is attained by a method similar to bulk polishing of a metal wiring material (barrier CMP). In bulk polishing of copper, dishing is particularly liable to occur in a wide metal wiring portion, and therefore, it is desirable to adjust the amounts of polishing removal in the wiring portion and in the barrier portion for the purpose of achievement of final flattening. Because of this, a polishing liquid for barrier polishing desirably has the optimal polishing selectivity for copper/barrier metal. In addition, because the wiring pitch or wiring density differs in a wiring layer of each level, it is still more desirable to be capable of adjusting, as appropriate, the above-mentioned polishing selectivity.

A metal-polishing solution used in CMP generally contains therein an abrasive (e.g., alumina or silica) and an oxidizing agent (e.g., hydrogen peroxide or persulfuric acid). The fundamental mechanism of CMP is thought to be oxidizing the metal surface with the oxidizing agent and removing an oxidized film thereof with the abrasive to carry out polishing. Reference to this mechanism can be found in Journal of Electrochemical Society, Vol. 138, No. 11, pp. 3460-3464, 1991.

However, carrying out CMP by use of a metal-polishing liquid containing therein such a solid abrasive may generate scratches, a phenomenon in which the entire surface to be polisheds are polished more than necessary (thinning), a phenomenon in which the polished metal surface sags on the dish (dishing), a phenomenon in which an inter-metal-wiring insulator is polished more than necessary and a plurality of wiring metal surfaces sag on the dish (erosion), or the like.

Additionally, in a washing step which is normally carried out for the removal of the polishing liquid remaining on the semiconductor surface after polishing, use of a polishing liquid containing a solid abrasive poses a problems with respect to cost because the polishing step is complicated and moreover processing of the liquid after washing (waste liquid) requires precipitation separation of the solid abrasive, and the like.

As one means to solve these problems, for example, a metal surface polishing method by means of a combination of a polishing liquid that does not contain an abrasive and dry etching is disclosed in Journal of Electrochemical Society, Vol. 147, No. 10, pp. 3907-3913, 2000, etc. Moreover, a metal-polishing liquid, which does not contain an abrasive therein, composed of hydrogen peroxide/malic acid/benzotriazol/ammonium polyacrylate and water is disclosed in, for example, JP-A No. 2001-127019, etc. According to these methods, the metal films of the convex portions of a semiconductor substrate are selectively subjected to CMP, and metal films remain in concave portions, whereby a desired conductive pattern is obtained. Since CMP proceeds by means of friction against a polishing pad that is mechanically much softer than conventional materials containing solid abrasives, generation of scratches is reduced. Due to a decrease in mechanical polishing force, however, these methods have a disadvantage in that it is difficult to obtain a sufficient polishing speed.

On the other hand, a polishing agent containing an abrasive has a characteristic of obtaining a high polishing speed. In general, fine particles of inorganic oxides such as silica, alumina, ceria, titania, and zirconia are used as abrasives. These abrasives are known to have both advantages and disadvantages. For example, silica is comparatively soft and thus hardly generates scratches, but the polishing speed thereof is not sufficient. On the other hand, alumina is hard and offers a high polishing speed, but it is liable to generate scratches and causes a problem of instability over time due to particle aggregation. Further, although a composite abrasive in which surfaces of silica are covered with alumina is disclosed in, for example, JP-A No. 2003-197573, it does not sufficiently exhibit the advantages of silica and alumina.

SUMMARY OF THE INVENTION

A first aspect of a invention is a metal-polishing liquid including, a colloidal silica at least one portion of the silicon atoms on the surfaces of which is substituted by aluminum atoms; and a compound represented by the following Formula (I) or a compound represented by the following Formula (II):

$$R^1-OOC-(CH_2)_m-COO-R^2 \quad \text{Formula (I)}$$

wherein in Formula (I), $R^1$ represents an alkyl group, alkynyl group, alkenyl group, allyl group or aryl group; $R^2$ represents hydrogen atom, an alkyl group, alkynyl group, alkenyl group, allyl group or aryl group; m represents an integer of 0 to 6, $$R^3-O-(CH_2CH_2O)_n-SO_3H \quad \text{Formula (II)}$$

wherein in Formula (II) $R^3$ represents an alkyl group or aryl group; and n represents an integer of 1 to 30.

DETAILED DESCRIPTION OF THE INVENTION

The present invention will be described in detail below. In the present specification " . . . to . . . " represents a range including the numeral values represented before and after "to" as a minimum value and a maximum value, respectively.

An aspect according to the present invention will be set forth in detail hereinafter.

A metal-polishing liquid .according to the present invention contains therein an oxidizing agent, and colloidal silica, at least one portion of the silicon atoms on the surfaces of which is substituted by aluminum atoms, and contains, as required, other compounds.

First, colloidal silica, which is a characteristic component of the present invention, will be described.

<Colloidal Silica, at Least One Portion of the Silicon Atoms on the Surfaces of which is Substituted by Aluminum Atoms>

A colloidal silica used in the present invention functions as an abrasive in the metal-polishing liquid according to the present invention, and may be referred to as a "specified colloidal silica" as appropriate herein below.

In the present invention, "colloidal silica, at least one portion of the silicon atoms on the surfaces of which is substituted by aluminum atoms" means a state in which aluminum atoms are present on the surfaces of colloidal silica having sites containing silicon atoms with a coordination number of 4 and may also be a state in which an aluminum atom having 4 oxygen atoms coordinated thereto binds to the colloidal silica surface to generate a new surface in which the aluminum atom is immobilized in a tetracoordinate state or a state in which a silicon atom present on the surface is once extracted and substituted by an aluminum atom to form a new surface.

The colloidal silica used in preparation of the specified colloidal silica is more preferably colloidal silica which does not contain impurities such as alkaline metals inside the particle, and which is obtained by hydrolysis of an alkoxy silane.

The particle diameter of the colloidal silica to be used as a raw material is appropriately selected, according to the purpose of use of the abrasive. In general, however, it is about 2 to 300 nm, preferably 5 to 1000 nm, and more preferably 20 to 60 nm.

The method of substituting a silicone atom on such a colloidal silica particle surface by an aluminum atom to obtain the specified colloidal silica preferably includes, for example, a method of adding an aluminate compound such as ammonium aluminate to a dispersion solution of colloidal silica; and the method is described in detail in Japanese Patent No. 3463328 and JP-A No. 63-123807, and the descriptions therein can be applied to the present invention.

Additionally, as another method, it is prefer to apply a method of adding an aluminum alkoxide to a dispersion solution of colloidal silica.

While the kind of aluminum alkoxides is not particularly restricted, aluminum alkoxide is preferably aluminum isopropoxide, aluminum butoxide, aluminum methoxide, or aluminum ethoxide, and more preferably aluminum isopropoxide or aluminum butoxide.

In the specified colloidal silica, a tetracoordinate aluminate ion reacts with a silanol group on the surface of colloidal silica to form an aluminosilicate site, which immobilizes a negative charge and imparts a large zeta potential to a particle, and thus is excellent in dispersing ability even under acidity. Hence, it is important that the specified colloidal silica produced by an above-described method includes an aluminum atom coordinated by 4 oxygen atoms.

This structure in which silicon atoms are substituted by aluminum atoms on the colloidal silica surface can be readily confirmed by the measurement of the zeta potential of the abrasives.

For the amount of substitution of silicon atoms on the colloidal silica surface for aluminum atoms, the percentage of substitution of surface atoms of the colloidal silica (a number of introduced aluminum atoms/a number of surface silicon atom sites) is preferably 0.001% to 20%, more preferably 0.01% to 10%, and furthermore preferably 0.1% to 5%.

When silicon atoms on the colloidal silica surface are substituted for aluminum atoms, the amount of substitution for aluminum atoms may be controlled, as appropriate, by control of the amount (concentration) of an aluminate compound, an aluminum alkoxide or the like added to the dispersion solution of colloidal silica.

The amount of aluminum atoms introduced into the colloidal silica surface (number of introduced aluminum atoms/number of surface silicon atom sites) may be estimated from the surface area calculated from the diameter of the colloidal silica, the specific gravity 2.2 of colloidal silica, and the number of silanol groups per unit surface area (5 to 8 groups/$nm^2$), on the assumption that an aluminum compound added to the dispersion solution is reacted in an amount of 100%. In an actual measurement, the specified colloidal silica itself that is obtained is subjected to elemental analysis, and the introduced amount is evaluated by applying "the surface area/the specific gravity" and the number of silanol groups per unit surface area, on the assumption that aluminum is not present within the particle, but is uniformly spread on the surface.

A specific method of manufacture involves, for example, dispersing 1 to 50% by mass of colloidal silica in water, adding a pH adjusting agent into the dispersion solution to adjust the pH of 7 to 11, adding an aqueous ammonium aluminate solution to the resulting solution at about room temperature, agitating the solution at the same temperature for 1 to 10 hours, and subsequently removing impurities by ion exchange, ultrafiltration, or the like to obtain the specified colloidal silica.

The size of the specified colloidal silica thus obtained (average value of volume equivalent diameter) is preferably 3 nm to 200 nm, more preferably 5 nm to 100 nm, and furthermore preferably 10 nm to 60 nm. In addition, the particle size of the specified colloidal silica (volume equivalent diameter) is determined by dynamic light scattering.

In PH-adjusting, a known pH-adjusting agent may be used, for example, an acid (e.g., sulfuric acid, nitric acid, boric acid, or phosphoric acid), or an alkali (e.g., ammonia, or ammine compound).

The pH of a metal-polishing liquid according to the present invention is preferably 2 to 7, and more preferably 3 to 6.

The weight ratio of the specified colloidal silica based on the abrasives contained in a metal-polishing liquid according to the present invention is preferably 50% or more, and more preferably 80% or more. All the abrasives contained therein may be the specified colloidal silica.

The content of the specified colloidal silica based on a metal-polishing liquid of situation of use is preferably 0.001% by mass to 5% by mass, more preferably 0.01% by mass to 0.5% by mass, and furthermore preferably 0.05% by mass to 0.2% by mass.

A metal-polishing liquid according to the present invention can contain, in addition to the above-mentioned specified colloidal silica, abrasives other than the specified colloidal silica as long as being not deviated from the effect of the present invention. The abrasives used here preferably include fumed silica, colloidal silica, ceria, alumina, titania or the like, and more preferably colloidal silica.

The size of abrasives other than the specified colloidal silica is preferably once to twice size of the above-mentioned specified colloidal silica.

<Compounds Represented by Formula (I)>

A metal-polishing liquid according to the present invention contains, together with the above-mentioned abrasives, a compound represented by the following Formula (I).

  Formula (I)

wherein $R^1$ represents an alkyl group, an alkenyl group, an allyl group or an aryl group; $R^2$ represents hydrogen atom, an alkyl group, an alkynyl group, an alkenyl group, an allyl group or an aryl group; m represents an integer of 0 to 6.

An alkyl group represented by $R^1$ and $R^2$ is preferably methyl group, ethyl group, propyl group, butyl group, or octyl group, and more preferably methyl group.

The alkyl groups represented by $R^1$ and $R^2$ include ethinyl group, propynyl group and the like.

An alkenyl groups represented by $R^1$ and $R^2$ include propynyl group, butylphenyl group and the like.

An aryl group represented by $R^1$ and $R^2$ is preferably phenyl group and pyridyl group, and more preferably phenyl group.

$R^1$ and $R^2$ may have an additional substituent. The substituent preferably includes an alkyl group, a hydroxyl group, an amino group, an alkoxy group and nitro group.

$R^1$ and $R^2$ is preferably hydrogen atom or an alkyl group, and more preferably hydrogen atom or a methyl group.

m is an integer of 0 to 6, preferably an integer of 2 to 4, and more particularly preferably 4.

It is preferable that a plurality of compounds represented by Formula (I) are contained in the metal-polishing liquid; it is more preferable that a plurality of compounds, which each have the same number of m and a different kind of $R^1$ or $R^2$, are made to coexist.

The compounds represented by Formula (I) include, for example, dimethyl oxalate, monomethyl oxalate, dimethyl malonate, dimethyl glutarate, dimethyl adipate or monomethyl adipate. Among them, dimethyl adipate or monomethyl adipate are particularly preferable.

The content of compound represented by Formula (I) is preferably 0.01 to 5% by mass, more preferably 0.05 to 1% by mass, and furthermore preferably 0.1 to 0.5% by mass, based on the total mass of the metal-polishing liquid.

Compounds represented by Formula (I) may be used alone, or in combination of two or more kinds.

<Compounds Represented by Formula (II)>

A metal-polishing liquid according to the present invention preferably contains a compound of the following Formula (II).

  Formula (II)

wherein $R^3$ represents an alkyl group or an aryl group.

An alkyl group represented by $R^3$ is preferably an alkyl group having 8 to 24 carbon atoms, and more preferably an alkyl group having 12 to 18 carbon atoms.

An aryl group represented by $R^3$ is preferably an aryl group having 6 to 14 carbon atoms, and more preferably an alkyl group having 6 to 10 carbon atoms, furthermore preferably phenyl group or naphthyl group.

$R^3$ may have an additional substituent.

A substituent of the alkyl group is preferably a halogen atom or a hydroxyl group.

A substituent of the aryl group is preferably an alkyl group, a halogen atom or an alkoxy group.

A substituent of the phenyl group is preferably an alkyl group, and more preferably an alkyl group having 5 to 15 carbon atoms.

$R^3$ is preferably an alkyl group or phenyl group, more preferably phenyl group having an alkyl group as a substitutent, and furthermore preferably phenyl group which has an alkyl group having 5 to 15 carbon atoms as a substitutent.

n represents an integer of 1 to 30, and preferably an integer of 10 to 20.

Compounds represented by Formula (II) include, for example, compound in which $R^3$ is a dodecylbenzene group or nonyl benzene group.

The content of compound represented by Formula (II) is preferably 0.001 to 5% by mass, more preferably 0.05 to 0.5% by mass, and furthermore preferably 0.01 to 0.05% by mass, based on the total mass of the metal-polishing liquid.

Compounds represented by Formula (II) may be used alone, or in combination of two or more kinds.

Compounds represented by Formulae (I) and (II) may be used alone, or in combination of two or more kinds. For combination, the content ratio is 100:1 to 1:100, and more preferably 10:1 to 1:5.

<Oxidizing Agents>

The metal-polishing liquid according to the present invention preferably contains an oxidizing agent.

The oxidizing agents include, for example, hydrogen peroxide, peroxides, nitrates, iodates, periodates, hypochlorites, chlorites, chlorates, perchlorates, persulfates, dichromates, permanganates, ozone water, silver(II) ozonide, and ferric (III) salts.

Ferric(III) salts that are preferably used include, for example, inorganic ferric(III) salts such as iron(III) nitrate, iron(III) chloride, iron(III) sulfate, and iron(III) bromide, and organic complex salts of iron(III).

For the use of organic complex salts of iron(III), complex-forming-compounds which constitute iron(III) complex salts include, for example, acetic acid, citric acid, oxalic acid, salisylic acid, diethyldithiocarbanic acid, succinic acid, tartaric acid, glycolic acid, glycine, alanine, asparaginic acid, thioglycolic acid, ethylene diamine, trimethylene diamine, diethylene glycol, triethylene glycol, 1,2-ethanedithiol, malonic acid, glutaric acid, 3-hydroxybutylic acid, propionic acid, phthalic acid, isophthalic acid, 3-hydroxysalisylic acid, 3,5-dihydroxysalisylic acid, gallic acid, benzoic acid, maleic acid, and salts thereof, and aminopolycarbonic acids and salts thereof.

Aminopolycarbonic acids and salts thereof include ethylenediamine-N,N,N',N'-tetraacetic acid, diethylenetriaminepentaacetic acid, 1,3-diaminopropane-N,N,N',N'-tetraacetic acid, 1,2-diaminopropane-N,N,N',N'-tetraacetic acid, ethylenediamine-N,N'-disuccinic acid (racemic form), ethylenediamine disuccinic acid (SS form), N-(2-carboxylate ethyl)-L-asparaginic acid, N-(carboxymethyl)-L-asparaginic acid, β-alaninediacetic acid, methyliminodiacetic acid, nitrilotriacetic acid, cyclohexanediaminetetraacetic acid, iminodiacetic acid, glycol ether diaminetetraacetic acid, ethylenediamine-N,N'-diacetic acid, ethylenediamineorthohydroxyphenylacetic acid, N,N-bis(2-hydroxybenzyl)ethylenediamine-N,N-diacetic acid and the like and salts thereof. Kinds of pair salts are preferably alkaline metal salts and ammonium salts, and more preferably ammonium salts.

Among them, hydrogen peroxide, iodates, hypochlorites, chlorates, persulfates, and organic complex salts of iron(III) are preferable. Preferable complex-forming-compounds for the use of organic complex salts of iron(III) can include citric acid, tartaric acid, or aminopolycarbonic acids (specifically, ethylenediamine-N,N,N',N'-tetraacetic acid, diethylenetriaminepentaacetic acid, 1,3-diaminopropane-N,N,N',N'-tetraacetic acid, ethylenediamine-N,N'-disuccinic acid (racemic form), ethylenediaminedisuccinic acid (SS form), N-(2-carboxylate ethyl)-L-asparaginic acid, N-(carboxymethyl)-L-asparaginic acid, β-alaninediacetic acid, methyliminodiacetic acid, nitrilotriacetic acid, and iminodiacetic acid).

Among the oxidizing agents, hydrogen peroxide is most preferable.

The amount of an oxidizing agent added to metal-polishing liquid is preferably 0.003 mol to 8 mol, more preferably 0.03 mol to 6 mol, and furthermore preferably 0.1 mol to 4 mol, based on 1 L of a metal-polishing liquid when the oxidizing agent is used for polishing. The amount of an oxidizing agent added is preferably 0.003 mol or more from the viewpoint of sufficient oxidation of a metal and a high CMP speed, and preferably 8 mol or less from the viewpoint of preventing roughness of a surface to be polished.

-Organic Acids Other than Compounds Represented by Formulae (I) and (II)-

A metal-polishing liquid according to the present invention may contain, as required, organic acids other than Component (4). The organic acids other than Component (4) herein mean compounds different in structure from Formulae (I) and (II), and do not contain the acids that function as the above-described oxidizing agents.

The organic acids other than Component (4) are more suitably selected from the following group.

That is, formic acid, acetic acid, propionic acid, butyric acid, valeric acid, 2-methylbutyric acid, n-hexanoic acid, 3,3-dimethylbutyric acid, 2-methylbutyric acid, 4-metylpentanoic acid, n-pentanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, and salts thereof such as ammonium salts thereof and alkaline metal salts thereof, and the like are enumerated as an organic acids other than Component (4).

The amount of an organic acid other than Component (4) added to the metal-polishing liquid can be 0.00005 to 0.0005 mol based on 1 L of the metal-polishing liquid when the organic acid is used (using liquid).

<Heterocyclic Compounds>

A metal-polishing liquid according to the present invention preferably contains at least one kind of heterocyclic compounds as a compound forming a passive film on the metal surface of a polishing object.

Herein, a "heterocyclic compound" refers to a compound having a heterocyclic ring containing one or more of heteroatoms. Heteroatoms mean atoms other than a carbon atom and a hydrogen atom. A heterocyclic atom means a cyclic compound having at least one heteroatom. A heteroatom means an atom forming a constituent of the cyclic system of a heterocyclic ring, and does not mean an atom positioned outside the ring, separated from the ring system through at least one non-conjugated single bond, and being a part of an additional substituent of the ring system.

Heterocyclic atom is preferably nitrogen atom, surfer atom, oxygen atom, selenium atom, tellurium atom, phosphorus atom, silicon atom or boron atom, more preferably nitrogen atom, sulfur atom, oxygen atom, or selenium atom, furthermore preferably nitrogen atom, sulfur atom, or oxygen atom, and still more preferably nitrogen atom or sulfur atom.

First, a heterocyclic ring to be main structure will be set forth.

A number of the ring members of the heterocyclic ring of the heterocyclic compound is not particularly limited. Both a single ring compound and a polycyclic compound having a condensed ring are acceptable. The number of members for a single ring is preferably 3 to 8, more preferably 5 to 7, and furthermore preferably 5 or 6.

The number of rings when a heterocyclic compound has a condensed ring is preferably 2 to 4, and more preferably 2 or 3.

These heterocyclic rings specifically include the following. However, they are not limited thereto.

Examples of the heterocyclic rings include a pyrrole ring, a thiophene ring, a furan ring, a pyrane ring, a thiopyrane ring, a imidazole ring, a pyrazole ring, a thiazole ring, an isothiazole ring, an oxazole ring, an isoxazole ring, a pyridine ring, a pyradine ring, a pyrimidine ring, a pyridazine ring, a pyrrolidine ring, a pyrazolidine ring, an imidazolidine ring, an isoxazolidine ring, an isothiazolidine ring, a piperidine ring, a piperadine ring, a morpholine ring, a thiomorpholine ring, a chroman ring, a thiochroman ring, an isochroman ring, an isothiochroman ring, an indoline ring, an isoindoline ring, a pilindine ring, an indolizine ring, an indole ring, an indazole ring, a purine ring, a quinolizine ring, an isoquinoline ring, a quinoline ring, a naphthylidine ring, a phthalazine ring, a quinoxaline ring, a quinazoline ring, a cinnoline ring, a pteridine ring, an acridine ring, a pipemidine ring, a phenanthroline ring, a carbazole ring, a carboline ring, a phenazine ring, an antilysine ring, a thiadiazole ring, an oxadiazole ring, a triazine ring, a triazole ring, a tetrazole ring, a benzoimidazole ring, a benzoxazole ring, a benzothiazole ring, a benzothiadiazole ring, a benzofuroxan ring, a naphthoimidazole ring, a benzotriazole ring, a tetraazaindene ring or the like, and more preferably include a triazole ring, a benzotriazole ring, a tetrazole ring or a triazine ring.

Next, substituent, that the above-mentioned heterocyclic ring may have, will be described.

In the present invention, when a specified portion is referred to as a "group," the case means that the portion itself may not be substituted, or may be substituted by one or more kinds (a possible maximum number or less) of substituents. For example, an "alkyl group" means a substituted or non-substituted alkyl group.

The substituents capable of being used in a heterocyclic compound used in the present invention include, for example, the following. However, they are not limited thereto.

Examples of the substituent include halogen atoms (fluorine atom, chlorine atom, bromine atom, or iodine atom), alkyl groups (are linear-chain, branched, or cyclic alkyl groups, and may be polycyclic alkyl groups like a bicycloalkyl group, or may include an active methine group), alkenyl groups, alkynyl groups, aryl groups, heterocyclic groups (substituted site is not restricted), acyl groups, alkoxycarbonyl groups, aryloxycarbonyl groups, heterocyclic oxycarbonyl groups, carbamoyl groups (carbamoyl groups having a substituent include, for example, an N-hydroxycarbamoyl group, N-acylcarbamoyl group, N-sulfonylcarbamoyl group, N-carbamoylcarbamoyl group, thiocarbamoyl group, and N-sulfamoylcarbamoyl group), carbazoyl groups, carboxyl groups or salts thereof, oxalyl groups, oxamoyl groups, cyano groups, carboneimidoyl groups, formyl groups, hydroxy groups, alkoxy groups (include groups containing a repeating unit of ethyleneoxy group or propyleneoxy group), aryloxy groups, heterocycloxy groups, acyloxy groups, (alkoxy or aryloxy)carbonyloxy groups, carbamoyloxy groups, sulfonyloxy groups, amino groups, (alkyl, aryl, or heterocyclo)amino groups, acylamino groups, sulfonamide groups, ureido groups, thioureido groups, N-hydroxyureido groups, imido groups, (alkoxy or aryloxy)carbonylamino groups, sulfamoylamino groups, semicarbazide groups, thiosemicarbazide groups, hydrazino groups, ammonio groups, oxamoylamino groups, N-(alkyl or aryl)sulfonylureido groups, N-acylureido groups, N-acylsulfamoylamino groups, hydroxyamino groups, nitro groups, heterocyclic groups containing a quatemized nitrogen atom (e.g., a pyridinio group, imidazolio group, quinolionio group, isoquinolionio group), isocyano groups, imino groups, mercapto groups, (alkyl, aryl, or heterocyclo)thio groups, (alkyl, aryl, or heterocyclo)dithio groups, (alkyl or aryl)sulfonyl groups, (alkyl or aryl)sulfanyl groups, sulfo groups or salts thereof, sulfamoyl groups (sulfamoyl groups having a substituent include, for example, an N-acylsulfamoyl group and N-sulfonylsulfamoyl group) or salts thereof, phosphino groups, phosphinyl groups, phosphinyloxy groups, phosphinylamino groups, and silyl groups or the like.

Among them, preferable substituents include, for example, halogen atoms (a fluorine atom, chlorine atom, bromine atom, or iodine atom), alkyl groups (are linear-chain, branched, or cyclic alkyl groups, and may be polycyclic alkyl groups like a bicycloalkyl group, or may include an active methine group), alkenyl groups, alkynyl groups, aryl groups, heterocyclic groups (substituted site is not restricted), acyl groups, alkoxycarbonyl groups, aryloxycarbonyl groups, heterocyclic oxycarbonyl groups, carbamoyl groups, N-hydroxycarbamoyl groups, N-acylcarbamoyl groups, N-sulfonylcarbamoyl groups, N-carbamoylcarbamoyl groups, thiocarbamoyl groups, N-sulfamoylcarbamoyl groups, carbazoyl groups, oxalyl groups, oxamoyl groups, cyano groups, carboneimidoyl groups, formyl groups, hydroxy groups, alkoxy groups (include groups containing a repeating unit of ethyleneoxy group or propyleneoxy group), aryloxy groups, heterocycloxy groups, acyloxy groups, (alkoxy or aryloxy) carbonyloxy groups, carbamoyloxy groups, sulfonyloxy groups, (alkyl, aryl, or heterocyclo)amino groups, acylamino groups, sulfonamide groups, ureido groups, thioureido groups, N-hydroxyureido groups, imido groups, (alkoxy or aryloxy)carbonylamino groups, sulfamoylamino groups, semicarbazide groups, thiosemicarbazide groups, hydrazino groups, ammonio groups, oxamoylamino groups, N-(alkyl or aryl)sulfonylureido groups, N-acylureido groups, N-acylsulfamoylamino groups, hydroxyamino groups, nitro groups, heterocyclic groups containing a quaternized nitrogen atom (e.g., a pyridinio group, imidazolio group, quinolionio group, isoquinolionio group), isocyano groups, imino groups, mercapto groups, (alkyl, aryl, or heterocyclo)thio groups, (alkyl, aryl, or heterocyclo)dithio groups, (alkyl or aryl)sulfonyl groups, (alkyl or aryl)sulfanyl groups, sulfo groups or salts thereof, sulfamoyl groups (sulfamoyl groups having a substituent include an N-acylsulfamoyl group and N-sulfonylsulfamoyl group) or salts thereof, phosphino groups, phosphinyl groups, phosphinyloxy groups, phosphinylamino groups, silyl groups, carboxyl groups or the like.

Furthermore preferable substituents include, for example, halogen atoms (fluorine atom, chlorine atom, bromine atom, or iodine atom), alkyl groups (are linear-chain, branched, or cyclic alkyl groups, and may be polycyclic alkyl groups like a bicycloalkyl group, or may include an active methine group), alkenyl groups, alkynyl groups, aryl groups, heterocyclic groups (regardless of substituted sites) or the like.

The above-mentioned active methane group means a methine group substituted by two electron withdrawing groups; the electron withdrawing group means, for example, an acyl group, an alkoxycarbonyl group, an aryloxycarbonyl group, a carbamoyl group, an alkylsulfonyl group, an arylsulfonyl group, a sulfamoyl group, a trifluoromethyl group, a cyano group, a nitro group, and a carboneimidoyl group. The two electron withdrawing groups may be linked each other to form a cyclic structure. The salt means a cationic ion such as an alkaline metal; alkali earth metal, or heavy metal, and an organic cationic ion such as an ammonium ion or phosphonium ion.

Preferable electron withdrawing groups contained in an active methine group include an acyl group, aryloxycarbonyl group, sulfamoyl group, and carboneimidoyl group.

Two of the above-mentioned substituents are taken together with each other to be also capable of forming rings (aromatic or non-aromatic hydrocarbon rings or heterocyclic rings, which are furthermore combined to be capable of forming polycyclic condensed rings, and examples including a benzene ring, a naphthalene ring, an anthracene ring, a phenanthrene ring, a fluorine ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phennoxathiin ring, a phenothiazine ring, or a phenazine ring).

Specific examples of heterocyclic compounds that can be still preferably include, but are not limited to, the following.

The examples include 1,2,3,4-tetrazole, 5-amino-1,2,3,4-tetrazole, 5-methyl-1,2,3,4-tetrazole, 1,2,3-triazole, 4-amino-1,2,3-triazole, 4,5-diamino-1,2,3-triazole, 1,2,4-triazole, 3-amino-1,2,4-triazole, 3,5-diamino-1,2,4-triazole, benzotriazole, cyanuric acid or the like.

The heterocyclic compounds used in the present invention may be used alone, or in combination of two or more kinds. Specific examples of heterocyclic compounds, that can be preferably used, include a compound having both benzotriazole and cyanuric acid. The heterocyclic compounds used in the present invention can be synthesized according to the ordinary method, and may also utilize commercially available ones.

The total content of heterocyclic compounds used in the present invention is preferably in the range of 0.0001 to 1.0 mol, more preferably in the range of 0.0005 to 0.5 mol, and furthermore preferably in the range of 0.0005 to 0.05 mol, based on 1 L of a metal-polishing liquid for the use for polishing (i.e., a metal-polishing liquid diluted in case of dilution with water or an aqueous solution).

Another preferable example of a heterocyclic compound in metal-polishing liquids of the present invention is a heterocyclic compound having 3 or more nitrogen atoms within one molecule and having a condensed cyclic structure. On the other hand, a preferable example of a heterocyclic compound is a heterocyclic compound having 4 or more nitrogen atoms within one molecule. Furthermore, the above-described heterocyclic compounds more preferably contain therein a carboxyl group, sulfo group, hydroxy group, or alkoxy group.

The amount of heterocyclic compounds having a carboxyl group, a sulfo group, a hydroxy group, or an alkoxy group, added to the metal-polishing liquid, is preferably 0.0001% by weight to 0.005% by weight, and more preferably 0.0005% by weight to 0.002% by weight.

<Quaternary Alkyl Ammonium Compounds>

A metal-polishing liquid according to the present invention preferably contains a quaternary alkyl ammonium compound. Quaternary alkyl ammonium compounds include tetramethyl ammonium hydroxide, tetramethyl ammonium nitrate, tetraethyl ammonium hydroxide, tetraethyl ammonium nitrate, stearin trimethyl ammonium nitrate or the like, and more preferably trimethyl ammonium hydroxide.

The content of quaternary alkyl ammonium compound is preferably 0.01% by mass to 20% by mass, more preferably 0.1% by mass to 5% by mass, and furthermore preferably 0.5% by mass to 2% by mass.

<Water Soluble Polymers>

A metal-polishing liquid according to the present invention preferably contains a water soluble polymer. Water soluble polymers that can be preferably used include ammonium polyacrylate, polyvinyl alcohol, succinamide, polyvinyl pyrrolidone, polyethylene glycol, and polyoxyethylene-polyoxypropylene block copolymers.

The total addition amount of water soluble polymers added to the metal-polishing liquid is preferably 0.001 to 10 g, more preferably 0.01 to 5 g, and furthermore preferably 0.1 to 3 g, based on 1 L of a metal-polishing liquid upon the use in polishing. The addition amount of a hydrophilic polymer is preferably 0.001 g or more from the viewpoint of obtaining a sufficient effect, and preferably 10 g or less from the viewpoint of preventing a decrease in CPM speed. Additionally, the weight average molecular weight of these hydrophilic polymers is preferably 500 to 100000, and more preferably 2000 to 50000.

<Compounds Having at Least One Carboxyl Group and at Least One Amino Group within its Molecule>

A metal-polishing liquid according to the present invention preferably contains therein a compound having at least one carboxyl group and at least one amino group within its molecule; at least one of the amino groups of the compound is more preferably secondary or tertiary. The compounds preferably include α-amino acids such as glycine, alanine, valine, and glutamic acid; β-amino acids such as β-alanine; iminodiacetic acid, hydroxyethyliminodiacetic acid, hydroxyethylglycine, dihydroxyethylglycine, glycylglycine, N-methylglycine or the like.

More preferably, two or more kinds of compounds, having at least one carboxyl group and at least one amino group within its molecule, are contained in the metal-polishing liquid, and furthermore preferably a combination of a compound having only one carboxyl group within the molecule and a compound having two or more carboxyl groups within the molecule.

The addition amount of a compound having at least one carboxyl group and at least one amino group within its molecule is preferably 0.1% by mass to 5% by mass, and more preferably 0.5% by mass to 2% by mass.

<Compounds Having at Least One Amino Group and at Least One Sulfo Group within the Molecule>

A metal-polishing liquid according to the present invention preferably contains therein at least one amino group and at least one sulfo group within the molecule. The compounds include, for example, aminomethanesulfonic acid, and taurin or the like, and preferably taurin.

The addition amount of a compound having at least one amino group and at least one sulfo group within the molecule is preferably 0.1% by mass to 10% by mass, and more preferably 1% by mass to 5% by mass.

<Inorganic Components>

A metal-polishing liquid according to the present invention may contain therein, as required, an inorganic component for the purpose of polishing improvement.

The inorganic components include chlorides, sulfates, sulfites, persulfates, phosphates, and phosphites. Among them, phosphates and phosphites are preferable. It is also preferable that the components do not contain an inorganic component.

<Chemical-mechanical Polishing Method>

A metal-polishing liquid according to the present invention is applied to a chemical-mechanical polishing method described in detail below (hereinafter, also referred to as a "CMP method" or a "polishing method"). That is, the method involves contacting a metal-polishing liquid according to the present invention with a surface to be polished, relatively moving the surface to be polished and the polishing surface, and polishing a substrate having metal wiring formed therein to remove at least a portion of the metal.

The processed bodies to be a polishing object may include all materials which are required for flattening in any stages of manufacturing semiconductor device, such as a wafer having an electrically conductive film formed on the supporting substrate thereof and a laminate having an electrically conductive material film formed on a low dielectric insulating film (interlayer insulating film) disposed on wiring formed on the supporting substrate.

[Low Dielectric Insulating Film]

A low dielectric insulating film, which is an object to be polished, will be set forth. Conventionally, $SiO_2$ (relative dielectric constant: approximately 4.1) has been used as an interlayer insulating material of a semiconductor device. The dielectric constant of a low dielectric constant insulating film material in the present invention is defined to be 3.0 or less.

A low dielectric constant insulating film used in the present invention may be made of an organic or inorganic material, and preferably an organic-inorganic hybrid material such as SiOC or MSQ; or an organic polymer such as polyimide or Teflon (registered trade name). These materials may have fine pores.

The film forming method may be plasma CVD or spin coating. The dielectric constant is preferably lower, and more preferably 1.8 to 2.5. Specific examples include "Black Diamond (manufactured by Materials Inc., trade name)" by applying SiOC-plasma CVD method and "SiLK (manufactured by Dow Chemical Company, trade name)" of organic polymer.

[Wiring Metal Raw Materials]

In the present invention, a semiconductor to be a object to be polished is preferably a large-scale integrated circuit (hereinafter, as appropriate, designated by LSI) having a wiring comprised of a copper metal and/or copper alloy, more preferably a copper alloy, and furthermore preferably a copper alloy containing silver among copper alloys. The silver content contained in a copper alloy is preferably 40% by mass or less, more preferably 10% by mass or less, furthermore preferably 1% by mass or less; a copper alloy having a silver content of 0.00001 to 0.1% by mass has the most excellent effect.

[Width of Wiring]

In the present invention, in a semiconductor to be a object to be polished, for example in DRAM device systems, the half pitch of wiring in LSIs is preferably 0.15 μm or less, more preferably 0.10 μm or less, and furthermore preferably 0.08 μm or less, while the half pitch in MPU device systems is preferably 0.12 μm or less, more preferably 0.09 μm or less, and furthermore preferably 0.07 μm or less. For these LSIs, a polishing liquid of the present invention has particularly excellent effect.

[Barrier Metal]

In the present invention, a barrier metal layer is preferably disposed between wiring, in which the semiconductor is comprised of a copper metal and/or copper alloy, and an interlayer insulating film from the viewpoint of preventing diffusion of copper. The material constituting a barrier metal layer is suitably a metal material having a low resistance, more preferably TiN, TiW, Ta, TaN, W, or WN, and furthermore preferably Ta or TaN among them.

[Polishing Method]

The metal-polishing liquid has the case where the liquid is a concentrated solution and, upon use, water is added to dilute the solution to obtain a use solution; the case where respective components are in a form of an aqueous solution described in the next item, these are mixed and, if necessary, water is added to dilute the mixture to obtain a use solution; and the case where the liquid is prepared as a use solution. The polishing method using the metal-polishing liquid according to the present invention can be applied to any case, and is a method of supplying a polishing liquid to a polishing pad on a polishing platen, contacting this with a surface to be polished, and polishing the surface by relative movement between a surface to be polished and a polishing pad.

As a polishing apparatus, a general polishing apparatus having a holder for holding a semiconductor substrate having a surface to be polished, and a polishing platen to which a polishing pad is applied (a motor having a variable rotation number is attached) can be used. As a polishing pad, a general non-woven fabric, polyurethane foam and porous fluorine resin can be used, while the polishing pa is not particularly restricted. While a polishing condition is not limited, a rotation rate of a polishing platen is preferably 200 rpm or less so that a substrate is not flown out. The pressure of pressing the semiconductor substrate having a surface to be polished (polished film) against the polishing pad is preferably 10 to 600 hPa, more preferably 20 to 250 hPa in order to satisfy the uniformity of a polishing speed within the wafer surface and pattern flattening.

During polishing, a metal-polishing liquid is continuously supplied to a polishing pad with a pump. This supply amount is not limited, but it is preferable that a surface of a polishing pad is usually covered with a polishing liquid. A semiconductor substrate after completion of polishing is washed well in running water, and is dried after water droplets attached to a semiconductor substrate have been removed using a spin dryer. In the polishing method of the present invention, an aqueous solution used in dilution is the same as an aqueous solution described in the following. The aqueous solution is water containing in advance at least one of an oxidizing agent, acid, additive and surfactant; the total components of a component contained in the aqueous solution and a component of the diluted polishing liquid are made to be components when polishing is carried out by use of the polishing liquid. When a polishing liquid is used by dilution with an aqueous solution, a hardly soluble component can be blended in the form of an aqueous solution, and thus a more concentrated polishing liquid can be prepared.

The methods of adding water or an aqueous solution to a concentrated polishing liquid includes a method of joining a pipe supplying a concentrated polishing liquid and a pipe supplying water or an aqueous solution on the way and blending them, and then supplying the blended, diluted polishing liquid to the polishing pad. Methods of mixing that can be adopted include methods of being usually carried out such as a method of mixing by collision of each liquid through a narrow pathway under conditions of pressure application, a method of performing the repetition of branching, separating and joining the flow of a liquid that passes through a pipe having a filler such as glass tubes packed therein, and a method of providing blades rotated by a powder within a pipe.

The speed of supply of a polishing liquid is preferably 10 to 1000 ml/min, more preferably 170 to 800 l/min in order to satisfy the uniformity of a polishing speed within the wafer surface and pattern flattening.

The methods of diluting a concentrated polishing liquid with water, an aqueous solution or the like and polishing include a method of independently providing a pipe supplying a polishing liquid and a pipe supplying water or an aqueous solution; supplying specified amounts of the liquids from the respective pipes to the polishing pad; and moving relatively between the polishing pad and the surface to be polished to polish. Another method is a method of introducing a specified amount of a concentrated polishing liquid and water or an aqueous solution into one vessel and mixing; and then supplying its mixed polishing liquid to the polishing pad and polishing.

Another metal-polishing method of the invention is a method of separating a component to be contained in a polishing liquid into at least two constituents; when using the constituents, diluting them with water or an aqueous solution; supplying the resulting constituents to the polishing pad on the polishing platen; contacting them with a surface to be polished and polishing; and moving relatively between the surface to be polished and the polishing pad.

For example, an oxidizing agent is selected as one constituent (A); and an acid, additive, surfactant and water are selected as constituent (B). When they are used, the constituent (A) and the constituent (B) are diluted with water or an aqueous solution for use.

In still another method, additives having low solubility are divided into two constituents (A) and (B). An oxidizing agent, additive and surfactant are selected as one constituent (A); and an acid, additive, surfactant and water are selected as one constituent (B). When they are used, the constituent (A) and the constituent (B) are diluted with water or an aqueous solution for use. For this example, three pipes are needed that supply the constituent (A), the constituent (B) and water or an aqueous solution. For dilution and mixing, the three pipes are connected to one pipe that supplies a polishing liquid, and mixing is carried out within the pipe. In this case, it is also possible that two pipes are connected and then another pipe is connected thereto.

For example, another method includes mixing a constituent containing a hardly soluble additive and another constituent; ensuring a dissolution period of time by elongation of the mixing pathway; and then furthermore connecting a pipe of water or an aqueous solution. The other mixing methods include a method of leading the three respective pipes as described above to the polishing pad; and moving relatively between the polishing pad and the surface to be polished: and a method of mixing three constituents in one vessel; and then supplying the diluted polishing liquid to the polishing pad. In the above-described polishing methods, it is also possible that one constituent containing an oxidizing agent is made to be 40° C. or lower, and that another constituent is heated to a range of room temperature to 100° C., and that when one constituent and another constituent or water or an aqueous solution are mixed and diluted for use, the resulting solution is made to be 40° C. or lower. This is a preferable method for increasing the solubility of a raw material having a low solubility of a polishing liquid because raising a temperature renders solubility to increase.

A raw material made by dissolution of another component not containing an oxidizing agent by application of heat at a range of room temperature to 100° C. precipitates in the solution when the temperature is decreased. Thus, when the component the temperature of which is lowered is used, the precipitate needs to be dissolved by application of heat in advance. This makes it possible to adopt means of transporting a constituent liquid dissolved by application of heat and means of agitating a liquid containing a precipitate and dissolving it by application of heat to the pipe during transport of the liquid. When the temperature of one constituent having a heated component containing an oxidizing agent is raised to 40° C. or higher, there is a fear of decomposition of the oxidizing agent. Hence, when the heated constituent and one constituent containing an oxidizing agent that cools the heated constituent are blended, the temperature of the mixture is made to be 40° C. or lower.

In the invention, the component of a polishing liquid may be separated into two or more separated solutions as described above to be supplied to a surface to be polished. In this case, components that are separated into a component containing an oxide and a component containing an acid are preferably supplied. In addition, a concentrated liquid of a polishing liquid and water for dilution may also be separately supplied to a surface to be polished.

[Pad]

A pad for polishing may be either a non-foamed structure pad or a foamed structure pad. The former uses a hard synthetic resin bulk material like a plastic plate for a pad. The latter is furthermore classified into three categories: a closed cell foam (dry foam material), an open cell foam (wet foam material), and a two-layer composite (laminate material). In particular, the two-layer composite (laminate material) is preferable. Foaming may be either uniform or non-uniform.

The pad may also further contain abrasives for polishing (e.g., ceria, silica, alumina, resin, etc.). They each are a soft or hard pad; both are acceptable. In a laminate, a different hardness is preferably used for each layer. The material is preferably unwoven fabric, artificial leather, polyamide, polyurethane, polyester, polycarbonate, or the like. In addition, the surface attached to a surface to be polished may be subjected to processing of lattice grooves, holes, concentric grooves, spiral grooves or the like.

[Wafer]

A subject wafer on which CMP is performed with the metal-polishing liquid according to the present invention has a diameter of preferably 200 mm or more, more preferably 300 mm or more. When a diameter is 300 mm or more, the effect of the present invention is remarkably exerted.

EXAMPLES

The present invention will be described in more detail with reference to the following examples, but the present invention is not constructed as being limited thereto.

[Preparation of the Specified Colloidal Silica (A-1 to A-6)]

Colloidal silica abrasives having average particle sizes of 5 nm [(A-3)], 50 nm [(A-1)] or 200 nm [(A-4)] each were made to be 500 g of 20 wt % water dispersions. Sodium hydroxide was added thereto and dispersions having a pH of 9.5 were prepared. Then, aqueous sodium aluminate solutions (1% by weight) were added thereto at room temperature with agitation over 5 min in an amount suitable for a desired aluminum atom introduction amount, and the agitation was continued for another three hours. The resulting dispersions were purified by means of ultrafiltration and ion exchange to produce each of the abrasives.

Abrasives (A-2) were made to a pH of 9.5 by adding ammonia to 500 g of a 20 wt % aqueous dispersion of colloidal silica having an average particle diameter of 50 nm. Thereafter, to the dispersion was gradually added an ethanol solution of 1% by weight of aluminum isopropoxide over one hour while the dispersion cooled with ice water. After completion of the addition, the temperature of the dispersion was returned to room temperature, and the dispersion was kept on agitating for another 10 hours and then was purified by means of ultrafiltration and ion exchange to produce the abrasives.

Abrasives (A-5) and (A-6) were prepared as in the adjustment of abrasives (A-1), except for adjusting the addition amounts of sodium aluminate so as to be substitution amounts of the surface atom of colloidal silica shown in Table 1.

Colloidal silicas (A-1) to (A-6) at least one portion of the silicon atoms on the surfaces of which is substituted by aluminum atoms as shown in Table 1 were prepared by means of the above-described method.

For the amount of substitution of silicon atoms of the colloidal silica surface, the added sodium aluminate and aluminum tetramethoxide are assumed to react in an amount of 100%. The amount of surface atom substitution of colloidal silica (the number of introduced aluminum atoms/the number of surface silicon atom sites) was estimated from the surface area in terms of the diameter of colloidal silica, the specific gravity of colloidal silica: 2.2, and the number of silicon atoms per unit surface area: $13/nm^2$.

TABLE 1

| Abrasive | Size of Colloidal silica (nm) | Surface modifying agent | Number of introduced aluminum atoms/number of surface silicon atom sites (%) |
|---|---|---|---|
| A-1 | 50 | Sodium aluminate | 0.8 |
| A-2 | 50 | Aluminum tetraisopropoxide | 0.8 |
| A-3 | 5 | Sodium aluminate | 0.8 |
| A-4 | 200 | Sodium aluminate | 0.8 |
| A-5 | 50 | Sodium aluminate | 0.01 |
| A-6 | 50 | Sodium aluminate | 15 |

[Preparation of Metal-polishing Liquid]

Metal-polishing liquids of Examples 1 to 9 were prepared by use of the specified colloidal silicas obtained as described above as abrasives on the basis of the compositions indicated in Table 2 below.

Metal-polishing liquids of the present invention were prepared by adding purified water into the compositions of Table 2 below so as to be 1000 mL as a total volume.

The adjustment of pH was carried out with ammonia and nitric acid.

A compound represented by Formula (II) used in Example 10 is in the following:

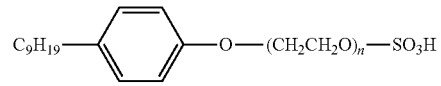

wherein n is 10.

[Polishing Conditions]

The film provided in each wafer was polished in the following conditions, while slurry is supplied, by means of a polishing apparatus (trade name: LGP-613, manufactured by Lapmaster SFT Co., Ltd.).

Basis: 8-inch of silicon wafer with copper film and Ta film

Table revolution number: 50 rpm

Head revolution number: 52 rpm

Polishing pressure: 168 hPa

Polishing pad: Product No. IC-1400, Manufactured by Rodel Nitta Corporation

Slurry supply speed: 200 ml/min

[Evaluation of Polishing Speed]

A difference of the film thickness between before and after applying copper CMP was evaluated in terms of the electrical resistance value. The difference of film thickness was measured by means of VR-200 manufactured by International Electric Alpha Corporation. Specifically, the equation, polishing speed (nm/min)=[(thickness of copper and Ta films prior to polishing)−(thickness of copper and Ta films after polishing)]/polishing time, was used for calculation.

In addition, after a metal-polishing liquid was left to stand for one week, the polishing speed by using the metal-polishing liquid was evaluated under the above-described conditions, and the decreasing ratio of the polishing speed was determined. Specifically, the equation, the polishing speed decreasing ratio after one week (%)=[{(polishing speed just after metal-polishing liquid preparation)−(polishing speed after one week)}/(polishing speed just after metal-polishing liquid preparation)]×100, was used for calculation.

TABLE 2

| Slurry | Abrasives | Abrasive concentrations (% by mass) | pH | Compounds of Formula (I) | | Compound of Formula (II) (g/L) | Oxidizing agent $H_2O_2$ (Mass %) | Other additives and addition amounts | | |
|---|---|---|---|---|---|---|---|---|---|---|
| | | | | Dimethyl adipate (g/L) | Monomethyl adipate (g/L) | | | Adipic acid (g/L) | Benzotriazole (g/L) | Cyanuric acid (g/L) |
| Example 1 | A-1 | 3 | 4.1 | 2 | — | — | 1 | 1.5 | 1 | — |
| Example 2 | A-2 | 3 | 4.1 | 2 | — | — | 1 | 1.5 | 1 | — |
| Example 3 | A-3 | 3 | 4.1 | 2 | — | — | 1 | 1.5 | 1 | — |
| Example 4 | A-4 | 3 | 4.1 | 2 | — | — | 1 | 1.5 | 1 | — |
| Example 5 | A-5 | 3 | 4.1 | 2 | — | — | 1 | 1.5 | 1 | — |
| Example 6 | A-6 | 3 | 4.1 | 2 | — | — | 1 | 1.5 | 1 | — |
| Example 7 | A-1 | 3 | 8 | 2 | — | — | 1 | 1.5 | 1 | — |
| Example 8 | A-1 | 3 | 4.1 | 2 | 1.5 | — | 1 | 1.5 | 1 | — |
| Example 9 | A-1 | 3 | 4.1 | 2 | 1.5 | — | 1 | 1.5 | 1 | 0.05 |
| Example 10 | A-1 | 3 | 4.1 | — | — | 0.02 | 1 | 1.5 | 1 | 0.05 |
| Comparative Example 1 | A-1 | 3 | 4.1 | — | — | — | 1 | 1.5 | 1 | — |
| Comparative Example 2 | Colloidal silica (50 nm) | 3 | 4.1 | 2 | — | — | 1 | 1.5 | 1 | — |

In the table, "—" means no addition.

TABLE 3

|  | Polishing speed (nm/min.) | Decreasing ratio of polishing speed after one week (%) |
|---|---|---|
| Example 1 | 351 | 20 |
| Example 2 | 370 | 16 |
| Example 3 | 169 | 12 |
| Example 4 | 462 | 26 |
| Example 5 | 387 | 22 |
| Example 6 | 211 | 25 |
| Example 7 | 198 | 23 |
| Example 8 | 390 | 9 |
| Example 9 | 405 | 5 |
| Example 10 | 420 | 3 |
| Comparative Example 1 | 360 | 38 |
| Comparative Example 2 | 398 | 32 |

Table 3 shows that when a metal-polishing liquid according to the present invention is used, a sufficient polishing speed causing almost no problem during production is obtained and that stability over time is excellent.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A metal-polishing liquid comprising:
   a colloidal silica at least one portion of the silicon atoms on the surfaces of which is substituted by aluminum atoms; and
   a compound represented by the following Formula (I) or a compound represented by the following Formula (II):

   $$R^1-OOC-(CH_2)_m-COO-R^2 \quad \text{Formula (I)}$$

wherein in Formula (I), $R^1$ represents an alkyl group, an alkynyl group, an alkenyl group, an allyl group or an aryl group; $R^2$ represents a hydrogen atom, an alkyl group, an alkynyl group, an alkenyl group, an allyl group or an aryl group; and m represents an integer of from 0 to 6, and

   $$R^3-O-(CH_2CH_2O)_n-SO_3H \quad \text{Formula (II)}$$

wherein in Formula (II), $R^3$ represents an alkyl group or an aryl group; and n represents an integer of from 1 to 30, and further wherein the compound represented by Formula (I) is at least one of dimethyl adipate or monomethyl adipate.

2. The metal-polishing liquid according to claim 1, wherein dimethyl adipate and monomethyl adipate are used in combination as the compound represented by Formula (I).

3. The metal-polishing liquid according to claim 1, wherein $R^3$ in Formula (II) is a phenyl group having an alkyl group as a substituent.

4. The metal-polishing liquid according to claim 1, wherein $R^3$ in Formula (II) is a phenyl group which has an alkyl group having 5 to 15 carbon atoms as a substituent.

5. The metal-polishing liquid according to claim 1, further comprising benzotriazole.

6. The metal-polishing liquid according to claim 1, wherein the average primary particle diameter of the colloidal silica is 2 to 300 nm.

7. The metal-polishing liquid according to claim 1, wherein the pH thereof is 2 to 7.

8. The metal-polishing liquid according to claim 1, further comprising a quaternary alkyl ammonium compound.

9. The metal-polishing liquid according to claim 1, further comprising cyanuric acid.

10. The metal-polishing liquid according to claim 1, further comprising phosphoric acid or phosphorous acid.

11. A chemical-mechanical polishing method comprising:
    supplying the metal-polishing liquid according to claim 1 to a polishing pad on a polishing platen,
    rotating the polishing platen,
    relatively moving the polishing pad while the polishing pad is contacted with a surface to be polished of a object to be polished, and then
    polishing the surface to be polished of the object to be polished.

12. The chemical-mechanical polishing method according to claim 11, wherein the object to be polished is a substrate having wiring comprising copper or a copper alloy.

13. The chemical-mechanical polishing method according to claim 12, wherein the copper alloy contains silver in the range of 0.00001 to 0.1% by mass therein.

14. The chemical-mechanical polishing method according to claim 11, wherein the object to be polished has an insulating film provided on wiring comprised of copper or a copper alloy, and a barrier layer containing Ta or TaN is provided between the wiring and the insulating film.

15. The chemical-mechanical polishing method according to claim 11, wherein the rotation speed of the polishing platen is 200 rpm or less.

16. The chemical-mechanical polishing method according to claim 11, wherein an amount of supplying the metal-polishing liquid to a polishing pad is 170 to 800 ml/min.

* * * * *